United States Patent
Odajima et al.

(10) Patent No.: US 7,482,816 B2
(45) Date of Patent: Jan. 27, 2009

(54) VOLTAGE MONITOR AND ELECTRICAL STORAGE DEVICE USING THE SAME

(75) Inventors: Yoshimitu Odajima, Osaka (JP); Kazuki Morita, Osaka (JP); Junji Takemoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 190 days.

(21) Appl. No.: 11/663,806

(22) PCT Filed: Aug. 23, 2006

(86) PCT No.: PCT/JP2006/016481
§ 371 (c)(1), (2), (4) Date: Mar. 26, 2007

(87) PCT Pub. No.: WO2007/023849
PCT Pub. Date: Mar. 1, 2007

(65) Prior Publication Data
US 2008/0001593 A1    Jan. 3, 2008

(30) Foreign Application Priority Data
Aug. 25, 2005 (JP) .............................. 2005-243850
Oct. 25, 2005 (JP) .............................. 2005-309355

(51) Int. Cl.
*G01R 31/12* (2006.01)
(52) U.S. Cl. ..................... 324/548; 324/76.11; 320/132; 320/166

(58) Field of Classification Search ................ 324/548, 324/76.11; 320/132, 166
See application file for complete search history.

(56) References Cited

U.S. PATENT DOCUMENTS 6,323,623 B1 * 11/2001  Someya et al. ............. 320/166
2005/0266303 A1 * 12/2005  Kadouchi et al. ............. 429/92

FOREIGN PATENT DOCUMENTS

| JP | 63-245228 | 10/1988 |
| JP | 2001-208782 | 8/2001 |
| JP | 2002-281681 | 9/2002 |
| JP | 2003-168487 | 6/2003 |
| JP | 2004-271356 | 9/2004 |

* cited by examiner

*Primary Examiner*—Vincent Q Nguyen
(74) *Attorney, Agent, or Firm*—McDermott Will & Emery LLP

(57) ABSTRACT

In a voltage monitor that measures voltages applied to the terminals of each of a plurality of capacitors constituting a storage section, the each voltage applied to a connecting point between terminals of the capacitors in charging operation, is divided by resistors and the divided voltage is fed into a selector switch. The resistance values used for dividing the each voltage are determined in advance so that a short-circuit between adjacent input terminals of the selector switch allows the divided voltage to have a voltage shift remarkably larger or smaller than the divided voltage obtained under the normal charging operation.

8 Claims, 8 Drawing Sheets

VOLTAGE MONITOR AND ELECTRICAL STORAGE DEVICE USING THE SAME

RELATED APPLICATIONS

This application is the U.S. National Phase under 35 U.S.C. § 371 of International Application No. PCT/JP2006/316481, filed on Aug. 23, 2006, which in turn claims the benefit of Japanese Application Nos. 2005-243850 filed on Aug. 25, 2005 and 2005-309355 filed on Oct. 25, 2005, the disclosures of which Applications are incorporated by reference herein.

TECHNICAL FIELD

The present invention relates to a voltage monitor used for an electrical storage device that employs a plurality of capacitors arranged in series connection or in series-parallel connection.

BACKGROUND ART

In a conventional electrical storage device using a plurality of electrical double layer capacitors arranged in series connection, terminal voltage of each capacitor is detected through the following process. Each pair of two resistors connected in series is connected between each of the connecting points of capacitors, i.e., each terminal, and ground. The voltage at the connecting point of the two resistors (divided voltage) is fed into a selector switch. A microcomputer sends the selector switch a capacitor selecting signal to control the selector switch. Receiving the signal, the selector switch sends the divided voltage of the selected capacitor to the A/D converter of the microcomputer. In this way, the microcomputer calculates the divided voltage to find voltage between the terminals of each capacitor.

Such type of voltage monitor is disclosed in Japanese Patent Unexamined Publication No. 2004-271356. The aforementioned voltage monitor employs a multiplexer as a selector switch so that the multiplexer selects a connecting combination of a plurality of resistors.

However, the input terminals of the multiplexer are disposed at narrow intervals. When such a multiplexer is mounted as the selector switch on a circuit board, a short-circuit may occur between adjacent input terminals because of migration of metals constituting electrodes. This can be a cause of an inaccurate detection of the divided voltage of each capacitor. To avoid this, such a short-circuit is required to be detected.

As a method of detecting a short-circuit between the input terminals, the following is possible; for example, connect the input terminals located on the both sides of the input terminal connected to the output of divided voltage to ground, instead of connecting all the adjacent input terminals of the capacitor to the output of divided voltage. If a short-circuit occurs between the adjacent input terminals, the short-circuit is easily detected because the output of divided voltage is fixed to ground. However, the above-mentioned connecting method is not efficient, since the input terminals are alternately connected to output and ground, so that effectively usable number of the input terminals is reduced to half. Alternatively, a larger selector switch is required to be use, however, employing the larger selector switch inconveniently increases the size of the voltage monitor.

DISCLOSURE OF THE INVENTION

The object of the present invention is therefore providing a voltage monitor capable of easily detecting a short-circuit that occurs between adjacent input terminals, even when each divided voltage, which is detected at a connecting point of resistors, is fed into the input terminals disposed at a narrow intervals. The voltage monitor of the present invention detects the voltage applied to the both ends of each of first and the second capacitors which an electrical storage device contains at least and are connected in series. The voltage monitor has a charging circuit configured to apply voltage to the electrical storage device, a monitoring section and a controller. The monitoring section includes a first voltage-dividing section, a first input-terminal, a second voltage-dividing section, a second input-terminal and a selector switch. The first voltage-dividing section divides a voltage at a connecting point of the first and the second capacitors by a plurality of resistors. The divided voltage obtained at the first voltage-dividing section is fed into the first input-terminal. The second voltage-dividing section divides a voltage of the second capacitor on a side of a charging circuit by a plurality of resistors. The plurality of resistors takes a resistance value so that the second voltage-dividing section outputs a divided voltage different from that obtained by the first voltage-dividing section when capacities of the first and the second capacitors are same. The second input-terminal, which receives the divided voltage obtained at the second voltage-dividing section, is disposed adjacent to the first input-terminal. The selector switch selects either one output of the first terminal or the second terminal and sends it to the controller. The controller outputs a selection signal of the first and the second input-terminals to the selector switch, and calculates voltage applied to the both ends of the first capacitor and the second capacitor based on the output of the selector switch. The resistance value of the plurality of resistors forming the first and the second voltage-dividing sections is so defined that the output of the selector switch shows an abnormal voltage when a short-circuit has occurred between the first and the second input-terminals. Receiving the abnormal voltage, the controller calculates voltage applied to the both ends of the first capacitor and the second capacitor. From the abnormal result of the calculation, the controller finds the short-circuit between the first and the second input-terminals. By virtue of the structure above, when a short-circuit has occurred, output of divided voltages take a value that strays outside the range of normal divided voltage. As a result, a short-circuit between the input terminals can be easily detected.

DETAILED DESCRIPTION OF PREFERRED EMBODIMENT

First Exemplary Embodiment

Figure 1:
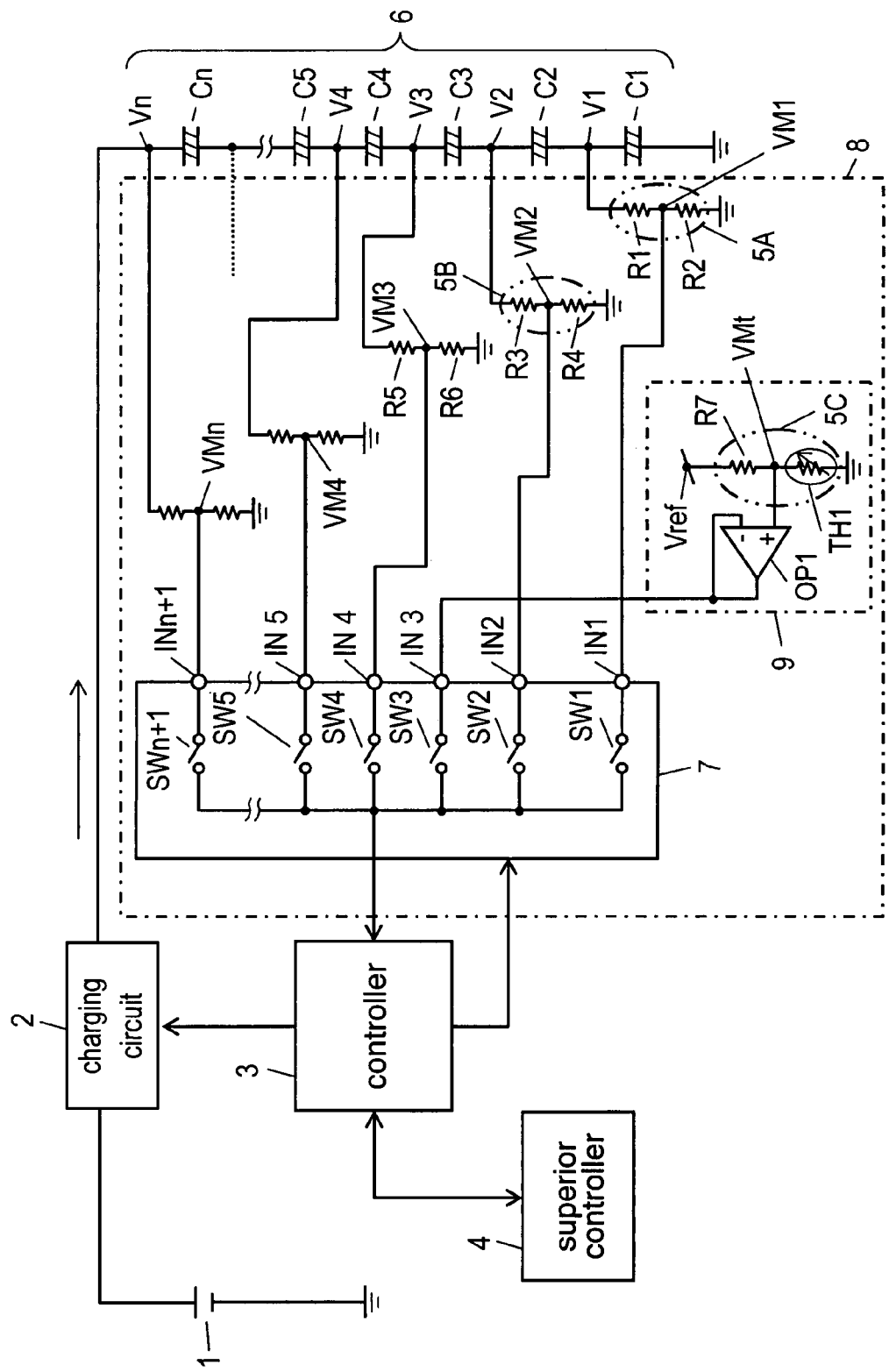
FIG. 1 is a circuit block diagram containing a voltage monitor in accordance with a first exemplary embodiment of the present invention.
Figure 2:
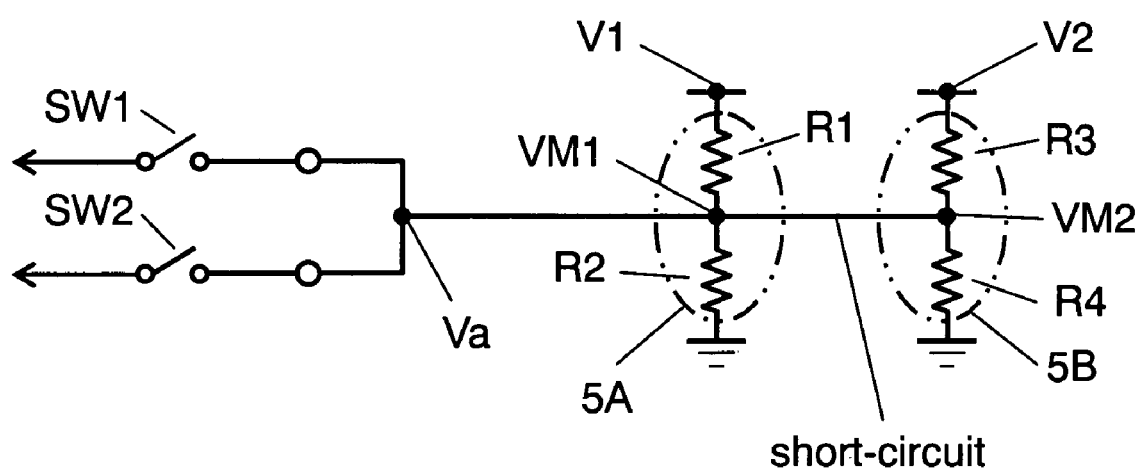
FIG. 2 is an equivalent circuit diagram when a short-circuit has occurred between input terminals of the voltage monitor of the first exemplary embodiment of the present invention.

FIG. 1 is a circuit block diagram containing a voltage monitor in accordance with a first exemplary embodiment of the present invention. FIG. 2 is an equivalent circuit diagram when a short-circuit has occurred between input terminals of the voltage monitor of the present exemplary.

Main power supply 1, which is formed of a battery or a generator, is connected to charging circuit 2. Charging circuit 2 controls charging voltage and charging current at each predetermined value. Charging circuit 2 receives operation instructions to start or stop charging from controller 3. As described later, controller 3 controls whole of the voltage monitor, and communicates with superior controller 4 to determine the start and stop of charging.

Storage section 6 is formed of electrical double layer capacitors C1 through Cn (n represents the number of capacitors) connected in series. With the use of resistors R1 and R2, voltage-dividing section 5A as a first voltage-dividing section divides voltage V1 applied to the connecting point of capacitor C1 and capacitor C2. The voltage divided at voltage-dividing section 5A is fed into input terminal IN1 as a first input terminal. With the use of resistors R3 and R4, voltage-dividing section 5B as a second voltage-dividing section divides voltage at the point of capacitor C2 on the side of charging circuit 2. The voltage divided at voltage-dividing section 5B is fed into input terminal IN2 disposed adjacent to input terminal IN1. As similar to the capacitors, voltage-dividing sections are provided at capacitors C3 through Cn, each of voltage-dividing sections divides voltage at the point of each capacitor on the side of charging circuit 2 with the use of a plurality of resistors. Storage section 6 is charged by charging circuit 2 up to a predetermined voltage.

Selector switch 7 receives a signal to select one switch of SW1 through SWn+1 from controller 3. Receiving the signal, selector switch 7 selects input terminal INx (x represents a selection signal, where $1 \leq x \leq n+1$) so as to corresponds to the selection signal, and outputs the voltage of input terminal INx to controller 3 as output of selector switch 7.

Monitoring section 8 has a plurality of voltage-dividing sections including voltage-dividing sections 5A, 5B, input terminals IN1 through INn+1, selector switch 7 and temperature-detecting section 9. Monitoring section 8 monitors voltages at connecting points of electrical double layer capacitors Cx of which voltages are different in the charging operation and also monitors ambient temperature in storage section 6.

Temperature-detecting section 9 outputs the ambient temperature so as to divide reference voltage Vref by resistor R7 and thermistor TH1 and output the voltage between them as a temperature output. The temperature output is fed, via operational amplifier OP1 as a voltage buffer, into input terminal IN3 that is one of the input terminals.

Receiving the temperature output above, controller 3 calculates the ambient temperature and controls selector switch 7. Controller 3 also monitors the charge status of storage section 6. Besides, controller 3 calculates voltage applied to each of capacitors C1 through Cn from each voltage of input terminals IN1 through INn+1. In a case where an abnormality is found in the calculation, controller 3 sends the information to superior controller 4 via communications. That is, controller 3 calculates voltage applied to both terminal of each of capacitors C1 through Cn according to the output from selector switch 7. Controller 3 sends a charging-stop instruction, as needed, to charging circuit 2. Besides, controller 3 stores resistance ratio for each voltage-dividing section.

Next will be described the workings of such structured voltage monitor. Receiving a charging-start instruction from controller 3, charging circuit 2 applies predetermined charging voltage to storage section 6 so as to charge storage section 6. At that time, the charging operation, if carried out under the condition where voltage applied to capacitors C1 through Cn is high, or ambient temperature is high, degrades capacity and internal resistance of the capacitors. To prevent the inconveniency, controller 3 monitors the voltage applied to capacitors C1 through Cn and ambient temperature. If abnormality occurs, for example, noticeably high application voltage or ambient temperature, controller 3 controls charging circuit 2 to stop the charging operation. As necessary, controller 3 has storage section 6 discharged. Controller 3 thus prevents excessive load on capacitors C1 through Cn. Adding forced-cooling components (not shown), such as a cooling fan or a cooling-water circulating passage and a pump, to the aforementioned structure is also effective in reducing overload on the capacitors. In this case, controller 3 controls the cooling components to decrease ambient temperature.

When the charging operation to storage section 6 completes successfully, controller 3 sends a charging-stop instruction to charging circuit 2. After that, controller 3 outputs selection signals one after another to selector switch 7.

By the selection signals, selector switch 7 knows that which input terminal INx should be selected. Accordingly, controller 3 receives divided voltages VM1 through VMn, which are divided from voltages V1 through Vn at the connection points of capacitors C1 through Cn from the outputs of selector switch 7.

According to divided voltages VM1 through VMn received, controller 3 estimates each voltage that is actually applied to capacitors C1 through Cn; specifically, controller 3 calculates voltages V1 through Vn at the connecting points by multiplying each divided voltage of VM1 through VMn by the reciprocal of the voltage-dividing ratio given to each voltage-dividing section. From the calculation result of VM1 through VMn, controller 3 further calculates voltage difference between adjacent connecting points: Vx+1−Vx. In this way, controller 3 estimates each voltage applied to both ends of capacitors C1 through Cn.

For example, when estimating the voltage applied to capacitor C2 as a second capacitor in FIG. 1, controller 3 calculates V2−V1. Here, V2 represents the voltage at the connecting point of capacitor 2 on the side of charging circuit 2, and V1 represents the voltage at the connecting point of capacitor C1 and capacitor C2. The details on the calculation will be described later.

Next how to detect the ambient temperature will be described. Reference voltage Vref as a fixed value is divided by resistor R7 as a first resistor and thermistor TH1 whose resistance value varies inversely with temperature. Resistor R7 and thermistor TH1 constitute third voltage-dividing section 5C for dividing reference voltage Vref. Divided voltage (i.e., temperature output) VMt obtained by resistor R7 and thermistor TH1 is fed to input terminal IN3 of selector switch 7 via operational amplifier OP1. Accordingly, by selecting input terminal IN3 to send the selection signal for selecting a input terminal, controller 3 receives temperature output VMt to calculate temperature.

From the data on voltage obtained above, controller 3 calculates voltage applied to each of capacitors C1 through Cn and the ambient temperature. If any one of the estimation values of each application voltage and the ambient temperature does not stay in a predetermined threshold range, controller 3 notifies the abnormal condition to superior controller 4 by means of communication output. Otherwise, that is, when the estimation values settle in the threshold range, controller 3 continues monitoring of the application voltages and the ambient temperature at regular intervals.

In FIG. 1, the voltage applied to the both ends of capacitor C2 is V2−V1. Therefore, controller 3 turns on switch SW1 and obtains divided voltage VM1 of voltage V1, VM1=V1× R2/(R3+R4), at first.

Next, controller 3 turns off switch SW1 and turns on switch SW2 to read divided voltage VM2 of voltage V2, VM2=V2× R4/(R3+R4).

Controller 3 multiplies read VM1 and VM2 by the reciprocal of the voltage-dividing ratio of voltage-dividing sections 5A and 5B, respectively, and then performs subtraction. Specifically, controller 3 calculates V2−V1, that is the voltage applied to the both ends of capacitor C2, from expression (1) below:

$$V_2 - V_1 = \frac{VM_2(R_3 + R_4)}{R_4} - \frac{VM_1(R_1 + R_2)}{R_2}. \quad (1)$$

Next will be specifically described how to detect a short-circuit failure between adjacent input terminals of input terminals IN1 through INn+1. As an example, here will be described on a case where the short-circuit has occurred between input terminals IN1 and IN2, with reference to FIG. 2. Under the condition, controller 3 reads a resultant voltage value Va of VM1 and VM2 shown in FIG. 2 regardless of whether controller 3 selects switch SW1 or switch SW2. The resultant voltage value Va is represented by expression (2) below:

$$V_a = \left( \frac{V_1 \cdot \frac{R_3}{R_2 // R_4 + R_3}}{R_1 + R_2 // R_3 // R_4} + \frac{V_2 \cdot \frac{R_1}{R_2 // R_4 + R_1}}{R_3 + R_1 // R_2 // R_4} \right) \times R_2 // R_4. \quad (2)$$

"//" is used for representing a resultant resistance value in parallel connection.

That is, voltage V2'−V1', which is calculated by controller 3 as a voltage applied to the both ends of capacitor C2, is represented by expression (3) below:

$$V_2' - V_1' = \frac{V_a(R_3 + R_4)}{R_4} - \frac{V_a(R_1 + R_2)}{R_2}. \quad (3)$$

In the calculation above, R1 through R4 are so set that VM1 does not equal to VM2. That is, in voltage-dividing section 5B, resistance values R3 and R4 are set so that a divided voltage is output so as to have a different value from voltage-dividing section 5A when the capacity of capacitor C1 is the same as that of capacitor C2. Likewise, the resistance values for other voltage-dividing sections are so defined that divided voltage VMn at input terminal INn is different from divided voltage VMn−1 at input terminal INn−1 adjacent to terminal INn.

In addition, resistance values R1 through R4 are set so that controller 3 calculates abnormal value V2'−V1' apparently different from normal value V2−V1 as a result of receiving abnormal output from selector switch 7 when a short-circuit between input terminals IN1 and IN2 occurs. In other words, resistance values R1 through R4 are set so as to invite a voltage shift that changes the detected voltage remarkably larger or smaller than VM1 and VM2 as a divided voltage obtained under the normal charging operation.

With the use of the predetermined resistance values, the calculated value V2'−V1' is completely different from the normal value V2−V1 which is calculated without a short-circuit, namely the calculated value V2'−V1' is an abnormal value. The value V2'−V1' is calculated by controller 3 from expressions (2) and (3) when a short-circuit has occurred between input terminals IN1 and IN2.

Furthermore, voltage threshold Vth is determined as an intermediate value between V2−V1 and V2'−V1' so as to satisfy the inequality of V2'−V1'>Vth>V2−V1 or V2'−V1'<Vth<V2−V1. In judgment employing the former inequality, controller 3 detects no short-circuit when an application voltage value of any given adjacent terminals, i.e., Vx+1−Vx is smaller than Vth; otherwise, controller 3 judges that a short-circuit has occurred. In contrast, in judgment employing the latter inequality, when Vx+1−Vx is greater than Vth, it shows normal operation; otherwise, a short-circuit has occurred. In this way, controller 3 detects a short-circuit between input terminals IN1 and IN2 from each voltage applied to each pair of ends of capacitors C1 and C2, here the voltages are calculated based on abnormal outputs from selector switch 7.

Voltage value V2−V1 is calculated as voltage applied to the both ends of capacitor C2. On the other hand, the voltage value of each capacitor is approximately estimated by dividing the voltage of storage section 6 as a whole in proportion to the reciprocal of capacitance of each capacitor. Therefore, a normal range of voltage of each capacitor can be determined in consideration of variations in capacitance of the capacitors. The upper and the lower limit values can be a threshold of the normal range of voltage.

Generally, each voltage-dividing section has same resistance dividing ratio in a condition that the voltage obtained by dividing voltage Vn of the topmost capacitor connected in series does not exceed the upper limit of an A/D converter of a microcomputer of controller 3. When divided voltage values VMn−1 and VMn are fed into adjacent input terminals of selector switch 7, a short-circuit between the adjacent input terminals is easily detected. This is because that voltage value V2−V1 equals to zero from expression (1); where, VM1 and VM2 become equal on the occurrence of a short-circuit, and dividing ratio is determined to be the same as described above. However, as the A/D converter of the microcomputer has an upper limit of withstanding voltage, divided voltage VM1 of capacitor C1 that is close to the ground (GND) potential become small when the resistance dividing ratio is set based on the high-voltage-side. Accordingly, the A/D value read at the microcomputer is subject to noise from the periphery. The adverse effect becomes serious as n in Cn, the number of series-connected electrical double layer capacitors, increases. In addition, when the voltage of an A/D terminal is lower than approx. 0.3 V, a leakage current from the A/D terminal becomes large. This increases the reading error when the microcomputer receives data from the A/D terminal.

To avoid the inconveniencies above, divided voltage VM1 of capacitor C1 should preferably be as large as possible so as not to exceed the upper limit of the A/D converter. To do so, the resistance dividing ratio for capacitor C1, i.e., (R1+R2)/R2, and the resistance dividing ratio for capacitor C2, i.e., (R3+R4)/R4 should preferably be small.

On the other hand, for a capacitor disposed away from ground, placed father than capacitor C3, resistance dividing ratio has to set large but kept below the upper limit of the A/D converter of the microcomputer. In this way, determining the resistance dividing ratio of each voltage-dividing section to be different improves precision of detecting divided voltage. However, such a setting is a detriment to a conventional method, whereby a short-circuit between the input terminals cannot be detected.

According to the embodiment, the resistance value of each voltage-dividing section is so determined that divided voltage VMn of input terminal INn has a different value from divided voltage VMn−1 of input terminal INn−1. Controller 3 judges that a short-circuit has occurred between the input terminals when the voltage applied to both ends of each capacitor takes a value higher or lower than a threshold. With the structure and workings described above, a short-circuit between the input terminals of selector switch 7 can be detected reliably. In addition, all of the input terminals can receive output of divided voltage in this structure, so that the input terminals are efficiently usable.

Here will be described a setting example of resistance value and resistance dividing ratio. In FIG. 1, suppose that six electrical double layer capacitors are connected in series (i.e., n=6) and a fully charged voltage between capacitors C1 through C6 is 12V. In this case, the voltage at both ends of each capacitor is 2V. For detecting voltage with high accuracy, the A/D converter of the microcomputer has an upper limit of voltage of 2.5V.

To make value of VM1 high so as to decrease adverse effect of noise on calculations carried out in the charging process, voltage-dividing section 5A corresponding to capacitor C1 has the following settings: R1=866Ω; R2=866Ω; (R1+R2)/R2=2, which is the resistance dividing ratio. Under the settings, voltage VM1 of input terminal IN1 measures 1V and calculated voltage V1 takes 2V under the normal condition with no short-circuit between the input terminals of selector switch 7.

On the other hand, voltage-dividing section 5B corresponding to capacitor C2 has the following settings: R3=4330Ω; R4=866Ω; (R3+R4)/R4=6, which is the resistance dividing ratio. Under the settings, voltage VM2 of input terminal IN2 measures 0.67V and calculated voltage V2 takes 4V under the normal condition with no short-circuit between the input terminals of selector switch 7. That is, V2−V1=2V. This means that voltage VM2 has a value different from voltage VM1.

In contrast, when a short-circuit has occurred between input terminals IN1 and IN2 of the selector switch, abnormal voltage Va takes 0.875V from expression (2). Therefore, V2'−V1'=5.25−1.75=3.25 (V).

When Vth is set, for example, to 2.625V which is an intermediate value between V2−V1 and V2'−V1', controller 3 detects a short-circuit between input terminals IN1 and IN2. The value given to Vth can be changed between V2−V1 and V2'−V1' as appropriate. For example, in a case where capacitors C1 through C6 have estimated variations in capacity of 10%, the lower threshold can be set to 1.8V. In this case, controller 3 detects a short-circuit when the calculated value is lower than 1.8 V. It can also possible that the upper threshold is set to 2.2V, and controller 3 detects a short-circuit when the calculated value is higher than 2.2V.

As the adverse effect by noise can be suppressed by setting the resistance dividing ratio of voltage-dividing section 5A so that VM1 takes a value greater than 0.3V, resistance dividing ratio can be set other than above-described value. In addition, the detection can be carried out in a lower-charged condition, although the description above is given on voltage detection under condition that storage section 6 is fully charged.

Second Exemplary Embodiment

Figure 3:
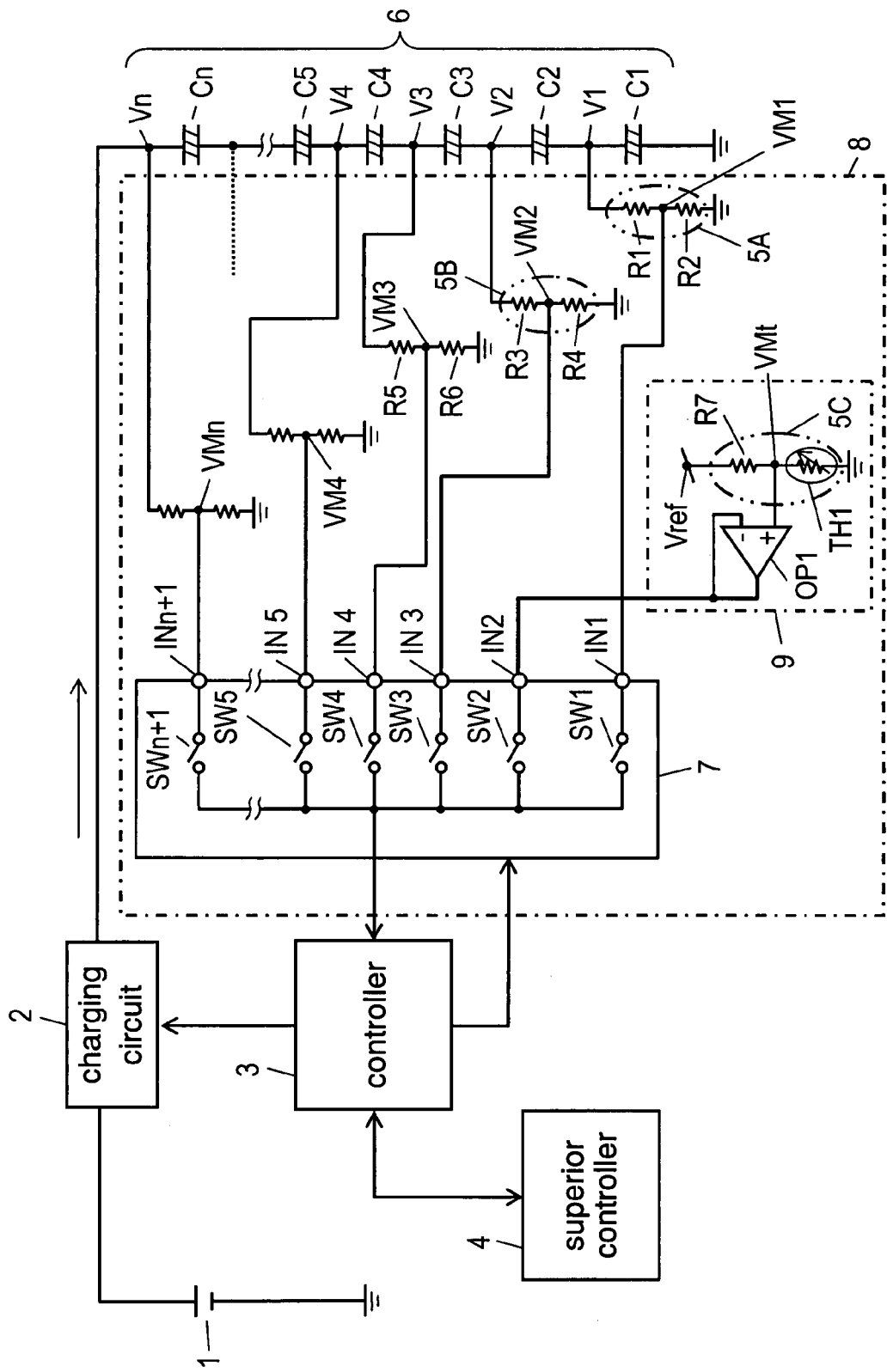
FIG. 3 is a circuit diagram containing a voltage monitor in accordance with a second exemplary embodiment of the present invention.
Figure 4:
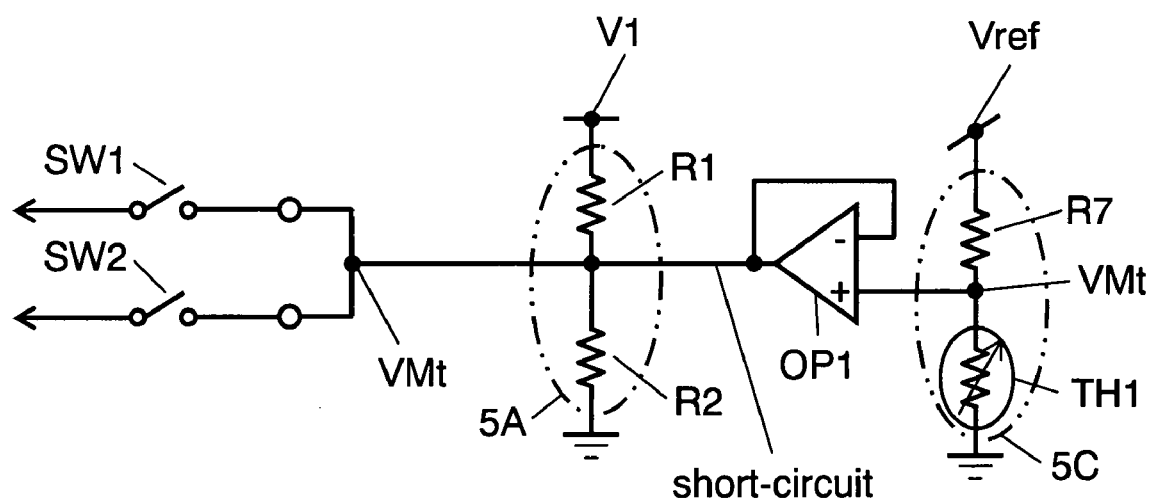
FIG. 4 is an equivalent circuit diagram when a short-circuit has occurred between an input terminal that receives the output of divided voltage at a divided voltage section and an input terminal that receives the output of temperature at a temperature-detecting section in the voltage monitor in accordance with the second exemplary embodiment of the present invention.
Figure 5A:
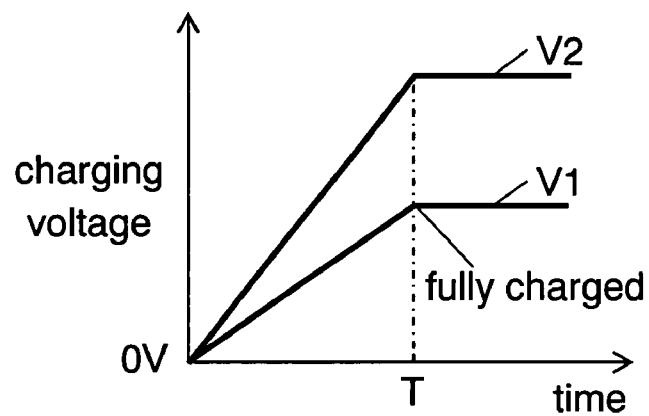
FIG. 5A is a chart showing time-varying characteristics of the voltage at a connecting point of capacitors under normal condition of the voltage monitor in accordance with the second exemplary embodiment of the present invention.
Figure 5B:
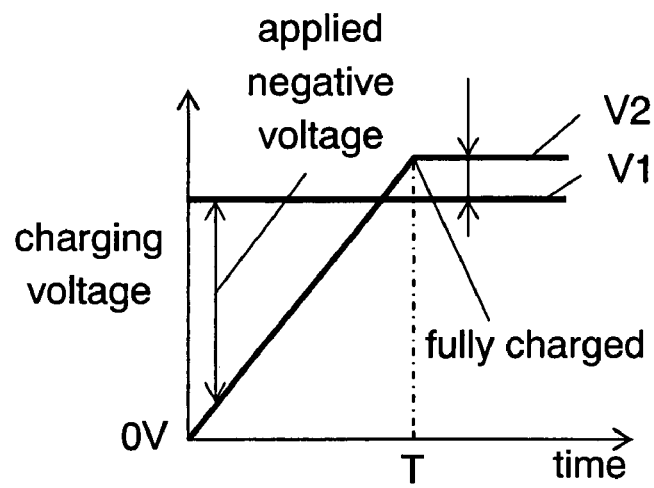
FIG. 5B is a chart showing time-varying characteristics of the voltage at a connecting point of capacitors when a short-circuit has occurred between the input terminals under the condition where the output voltage of temperature at the temperature-detecting section is higher than the output of divided voltage at the voltage-dividing section of a fully charged capacitor.
Figure 5C:
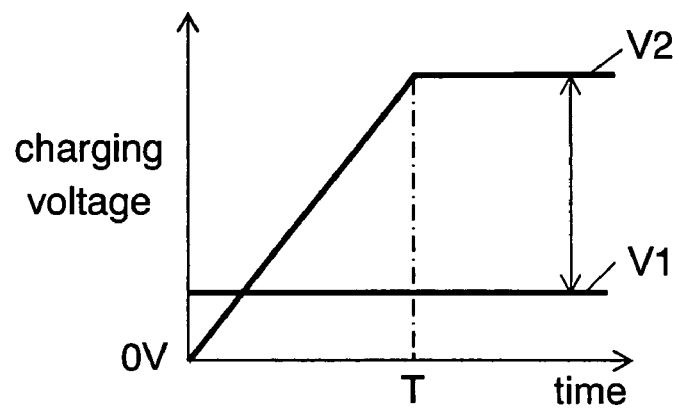
FIG. 5C a chart showing time-varying characteristics of the voltage at a connecting point of capacitors when a short-circuit has occurred between the input terminals under the condition where the output voltage of temperature at the temperature-detecting section is lower than the output of divided voltage at the voltage-dividing section of a fully charged capacitor.

FIG. 3 is a circuit diagram containing a voltage monitor in accordance with a second exemplary embodiment of the present invention. FIG. 4 is an equivalent circuit diagram when a short-circuit has occurred between an input terminal that receives the output of divided voltage at a divided voltage section and an input terminal that receives the output of temperature at a temperature-detecting section in the voltage monitor. FIGS. 5A through 5C are charts showing time-varying characteristics of the voltage of the voltage monitor. FIG. 5A shows time-varying characteristics of the voltage at a connecting point of capacitors under normal condition of the voltage monitor. FIG. 5B shows time-varying characteristics of the voltage at a connecting point of capacitors when a short-circuit has occurred between the input terminals under the condition where the output voltage of temperature at the temperature-detecting section is higher than the output of divided voltage at the voltage-dividing section of a fully charged capacitor. FIG. 5C shows time-varying characteristics of the voltage at a connecting point of capacitors when a short-circuit has occurred between the input terminals under the condition where the output voltage of temperature at the temperature-detecting section is lower than the output of divided voltage at the voltage-dividing section of a fully charged capacitor.

The voltage monitor shown in FIG. 3 differs from the structure shown in FIG. 1 of the first exemplary embodiment in the position of the input terminal that receives temperature output VMt of temperature-detecting section 9. Temperature output VMt of temperature-detecting-section 9 is fed to input terminal IN2, and divided voltage VM2 of voltage-dividing section 5B is fed to input terminal IN3. In the structure, input terminal IN3 is a second terminal for receiving divided voltage VM2; input terminal IN2 is a third terminal for receiving temperature output VMt. As for the rest of the structure, it is the same as that of the first exemplary embodiment; accordingly, like parts have similar reference marks and in-detail description thereof will be omitted.

The present embodiment introduces a method of detecting a short-circuit occurred in the following places: between input terminal IN2 for receiving temperature output VMt of temperature-detecting section 9 and input terminal IN1 for receiving divided voltage VM1 of voltage-dividing section 5A; or between input terminal IN2 and input terminal IN3 for receiving divided voltage VM2 of voltage-dividing section 5B.

A short-circuit between the input terminals of selector switch 7 in monitoring voltage applied to both ends of capacitors C1 through Cn is detectable by the method described in the first embodiment, that is, by determining in advance a resistance value of each voltage-dividing section for detecting a short-circuit and voltage threshold Vth for breakdown judgment. In temperature-detecting section 9, however, one of the resistors for dividing voltage is thermistor TH1 and the resistance value varies with temperature. It is therefore impossible to predetermine a short-circuit-detectable value to thermistor TH1. The reason will be described below.

Suppose that the following settings: value of Vref is 5V; the temperature range for correcting temperature characteristics of a capacitor ranges from −40° C. to +25° C.; value of R7 is 200 kΩ; thermistor TH1 has a resistance value of 10 kΩ at 25° C.; B-constant of a temperature characteristic takes a value of 3400. Under the setting condition, temperature dependence of VMt exhibits an exponential change as shown in table 1.

TABLE 1

| Temperature | Resistance value of TH1 (kΩ) | VMt (V) |
|---|---|---|
| −40° C. | 195 | 2.47 |
| −25° C. | 87.5 | 1.52 |
| 0° C. | 27.2 | 0.600 |
| 25° C. | 10.0 | 0.238 |

As shown in table 1, VMt ranges in a voltage range including divided voltage values VM1 and VM2 as temperature changes, whereby a short-circuit between adjacent input terminals, i.e., between IN2 and IN1, or between IN2 and IN3 cannot be detected.

The structure of FIG. 3 addresses the problem above. In the structure, resistor R7 and thermistor TH1 connected in series divide reference voltage Vref. The divided voltage (temperature output) is fed into input terminal IN2 of selector switch 7 via operational amplifier OP1 as a voltage buffer. Disposing the voltage buffer allows controller 3 to easily detect a short-circuit between IN2 and IN1 or between IN2 and IN3.

Hereinafter will be given more specific description on the detecting method. First, the description on a case of normal charging without a short-circuit between input terminals IN2 and IN1 (or IN3) to charge the capacitors normally, with reference to FIG. 5A. Showing changes in voltage in normal condition, VM1 of input terminal IN1 and VM3 of input terminal IN3 have a rise to reach a fully charged level; accordingly, V1 and V2 increase as shown in FIG. 5A.

Now will be given description on a case where VMt is higher than VM1 because of a short-circuit between input terminals IN1 and IN2 of selector switch 7 with reference to FIG. 5B. In normal condition without no short-circuit, the value of VM1 is calculated by the expression: VM1=V1×R2/(R1+R2). However, when a short-circuit has occurred between IN1 and IN2 as shown in FIG. 4, VM1 takes a value the same as VMt, which is voltage output (i.e., temperature output) of operational amplifier OP1 as a voltage buffer: VMt=Vref×TH1/(R7+TH1). Particularly, in a charging operation where storage section 6 is quickly charged from the charging start level (0V) to a predetermined fully-charged voltage, it is assumed that changes in ambient temperature is very small during the charging period from time 0 to time T. From the reason, VM1 of input terminal IN1 and VMt of input terminal IN2 are maintained at a fixed value; accordingly, V1 is constantly kept high as shown in FIG. 5B.

The value of voltage applied to both ends of capacitor C2, V2−V1, is negative at the start of charging, and turns positive before the fully charged condition. When the capacitor is fully charged, the voltage applied to both ends of capacitor C2, V2−V1, is detected as an extremely small value. On the other hand, the voltage applied to both ends of capacitor C1, V1, is detected as an extremely large value.

FIG. 5C shows a case where temperature output VMt at the occurrence of a short-circuit is smaller than fully charged voltage value V1 of capacitor C1. That is, the voltage applied to both ends of capacitor C2, V2−V1, is calculated by controller 3 as an abnormally large value.

As described above, a short-circuit involving temperature output VMt of temperature-detecting section 9 causes abnormal behaviors of application voltage of capacitors C1 and C2. Such as a decreasing application-voltage in charging; an application voltage with a negative value at an early stage of charging; and an extremely large application voltage at full charge are detected by controller 3. Based on the detected results, controller 3 recognizes that a short-circuit has occurred between input terminal IN2 for receiving temperature output of temperature-detecting section 9 and adjacent input terminal IN1 for receiving divided voltage. That is, when a short-circuit has occurred between input terminals IN2 and IN1, an abnormal voltage is applied to input terminal IN1. Receiving the abnormal voltage, controller 3 calculates each voltage applied to the both sides of capacitors C1 and C2. From the abnormality of the calculated value, controller 3 judges that a short-circuit has occurred between input terminals IN1 and IN2.

In the detection above, a threshold is defined for each case that shows abnormal voltage. Controller 3 distinguishes between the normal charging and the abnormal charging based on whether the calculated value exceeds or falls below the threshold or not. As described above, when the charging condition is detected from the voltage applied to the both ends of the fully charged capacitors, as is in the first exemplary embodiment, the threshold can be determined in consideration of variation in capacity of capacitors C1 through C6. In a case where capacitors C1 through C6 have estimated variations in capacity of 10%, the range of normal voltage is determined so as to have a lower limit of 1.8V or so as to have an upper limit of 2.2V. When the lower threshold is used as detection judgment, controller 3 detects a short-circuit from a voltage lower than 1.8 V; on the other hand, when the upper threshold is used, controller 3 detects a short-circuit from a voltage higher than 2.2V. Through the method above, a short-circuit involving temperature output of temperature-detecting section 9 can be easily detected.

When a short-circuit has occurred between input terminals IN2 and IN3, divided voltage VM2 at voltage-dividing section 5B is fixed to a value the same as temperature output voltage VMt. Even in this case, it is easily detected, as is the short-circuit between input terminals IN1 and IN2. It will be understood that the capacitors to be a detection target are C2 and C3, not C1 and C2.

With the simple structure and its workings described above, a short-circuit even involving temperature output of temperature detecting section 9, can be easily detected. In the structure of the present embodiment, all of the input terminals can be efficiently used for receiving output of divided voltage as same.

Although the embodiment describes a case of detecting a short-circuit between the terminal for receiving temperature output and terminal IN1 or IN3, it is not limited thereto. In the structure in which the terminal for receiving temperature output is changed, for example, to terminal IN4, short-circuit detection is carried out in a similar manner.

Third Exemplary Embodiment

Figure 6:
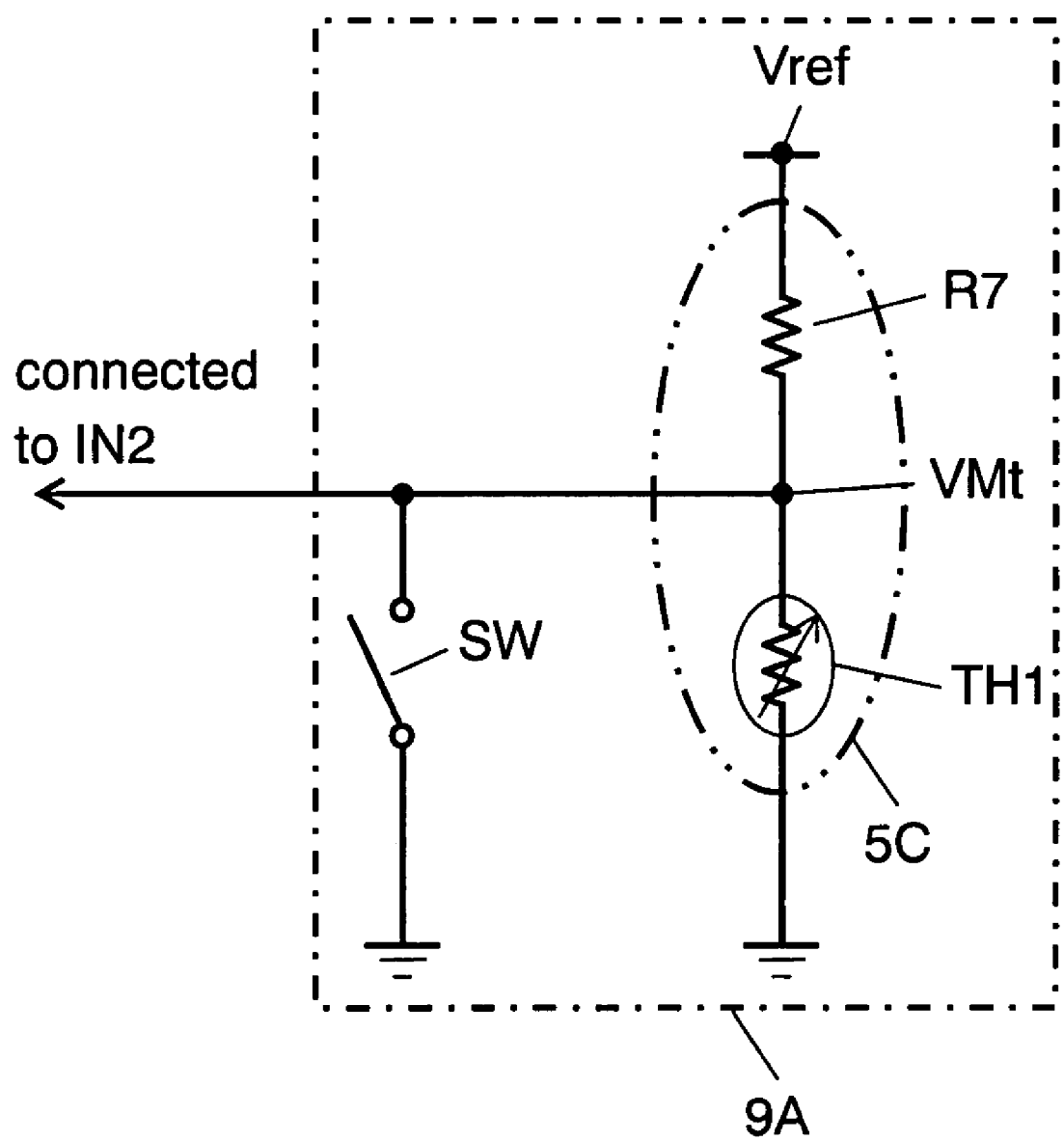
FIG. 6 is a circuit block diagram showing a temperature-detecting section of a voltage monitor in accordance with a third exemplary embodiment of the present invention.
Figure 7:
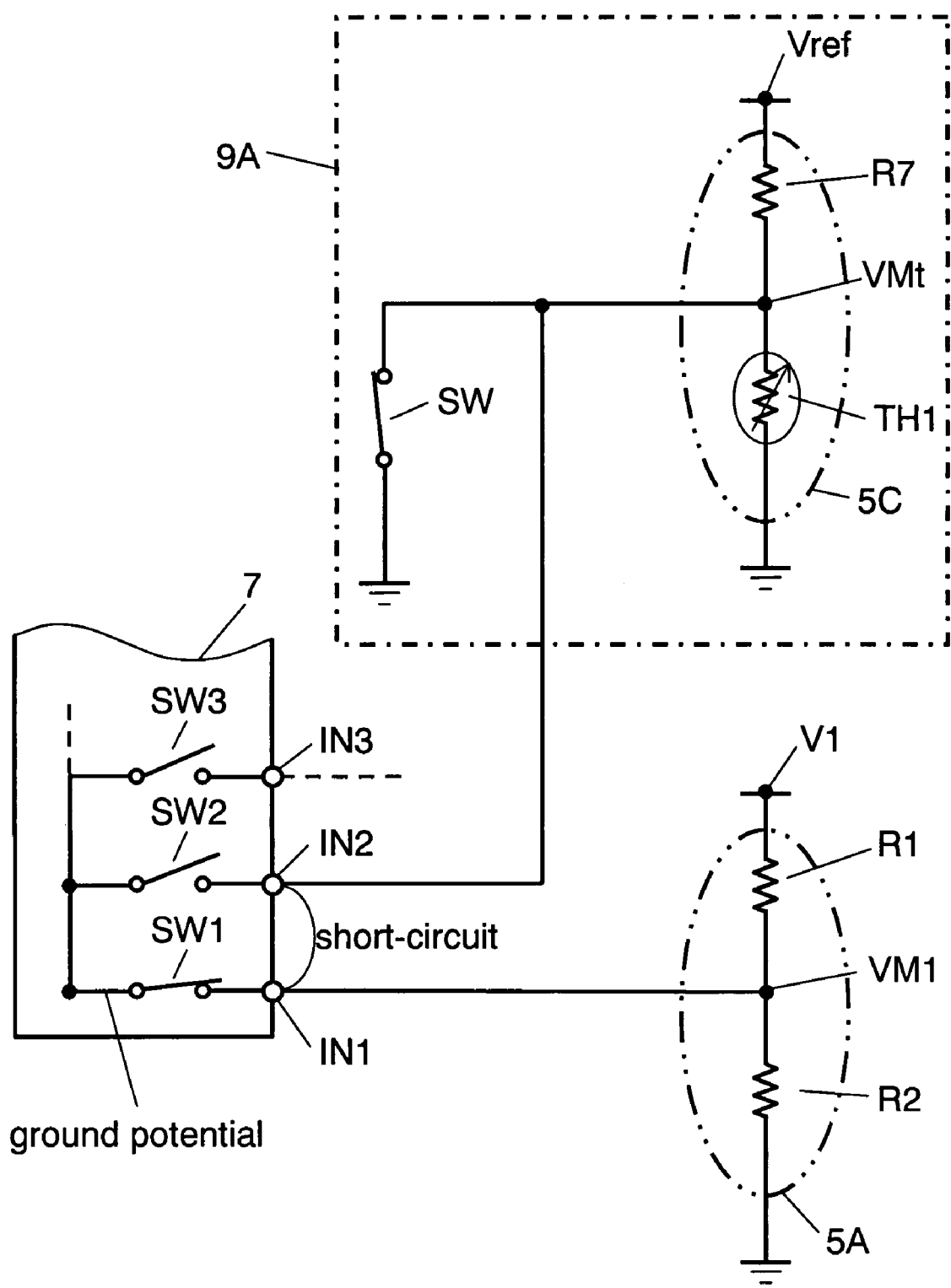
FIG. 7 is a partial circuit diagram showing a state in which output of divided voltage is selected when a short-circuit has occurred between the input terminal that receives the output of divided voltage at a voltage-dividing section and the input terminal that receives the output of temperature at a temperature-detecting section in the voltage monitor in accordance with the third exemplary embodiment of the present invention.

FIG. 6 is a circuit diagram showing the temperature-detecting section of a voltage monitor in accordance with the third exemplary embodiment. FIG. 7 is a partial circuit diagram showing a state in which output of divided voltage is selected when a short-circuit has occurred between the input terminal that receives the output of divided voltage at a voltage-dividing section and the input terminal that receives the output of temperature at the temperature-detecting section in the voltage monitor.

The structure of the embodiment differs from the structure of FIG. 3 in the second embodiment in employing temperature-detecting section 9A having the circuit structure of FIG. 6. The rest of the structure is almost the same as that in the second embodiment; accordingly, like parts have same reference marks and in-detail description thereof will be omitted. The description below will be focused on the different section.

According to the structure of the second embodiment, divided voltage (temperature output) of resistor R7 and thermistor TH1 is fed into operational amplifier OP1 as a voltage buffer. On the other hand, in the structure of the present embodiment, input terminal IN2 for receiving temperature output VMt is connected to specified voltage via externally controllable switch SW. Voltage-dividing section 5C as the third voltage-divider composed of resistor R7 as a first resistor and thermistor TH1, divides reference voltage Vref. The divided voltage (temperature output) of VMt output from voltage-dividing section 5C, is connected to switch SW. Switch SW connects a connecting point of resistor R7 and thermistor TH1 to the specified voltage when switch SW is turned on. According to the structure of the present embodiment, ground is employed for the specified voltage. In addition, controller 3 controls switch SW to turn it on and off.

Next will be described how temperature-detecting section 9A works under normal condition. In FIG. 7, when selector switch 7 selects an input terminal except IN2 that receives temperature output VMt of temperature-detecting section 9A under normal condition with no short-circuit, controller 3 turns on switch SW. This allows input terminal IN2 to be always connected to ground except when it detects temperature.

At detecting temperature, controller 3 sends a signal to selector switch 7 so as to select input terminal IN2 for receiving temperature output VMt. At the same time, controller 3 turns off switch SW, by which the connection between ground and temperature output VMt is cut off. Accordingly, the voltage at input terminal IN2 becomes equal to temperature output VMt, so that controller 3 calculates temperature. After calculating the ambient temperature in the storage section, the controller turns on switch SW. In this way, switch SW is turned off when the controller reads temperature output VMt; otherwise, it is kept on.

Next will be described how to detect a short-circuit between input terminal IN2 for receiving temperature output VMt and input terminal IN1 for receiving divided voltage VM1 of voltage-dividing section 5A when the short-circuit has occurred. As shown in FIG. 7, selector switch 7 selects input terminal IN1 under the condition in which a short-circuit has occurred between input terminals IN1 and IN2. In the state above, divided voltage VM1 of voltage-dividing section 5A is connected to ground, since switch SW is on. That is, the voltage of input terminal IN1 becomes equal to the ground level. As input terminal IN1 is at the ground level which is the specified voltage, controller 3 can detect a short-circuit between input terminals IN1 and IN2.

Once detecting the short-circuit between IN1 and IN2, controller 3 recognizes that the temperature output from input terminal IN2 which is to be selected next by selector switch 7 is abnormal, and doesn't carry out the conversion calculation to temperature. Controller 3 also notifies superior controller 4 via communications occurrence of a short-circuit and the abnormality of the temperature output. As necessary, controller 3 sends a charging-stop instruction to charging circuit 2.

As described above, under the condition in which a short-circuit has occurred between input terminal IN2 and its adjacent input terminal IN1 or input terminal IN3, when selector switch 7 selects input terminal IN1 or input terminal IN3, the voltage of the input terminal selected by becomes equal to a specific voltage. From such a simple criterion—whether or not the voltage of input terminal IN1 or input terminal IN3 is equal to the specific voltage, the presence or absence of a short-circuit can be detected. In addition, employing temperature-detecting section 9A shown in the circuit structure of FIG. 6 eliminates the need for disposing operational amplifier OP1, allowing the structure to be further simple and economical, compared to the structure in the second embodiment. With the structure and its workings, even when a short-circuit has occurred between an input terminal for temperature output of temperature-detecting section 9 and an input terminal for divided voltage used for calculating terminal voltage of a capacitor, the short-circuit can be detected with such a simple structure.

The short-circuit detection between input terminals other than the terminal that receives temperature output is the same as the method described in the first embodiment. Also in the structure, all of the input terminals can be efficiently used for receiving output of divided voltage.

Figure 8A:
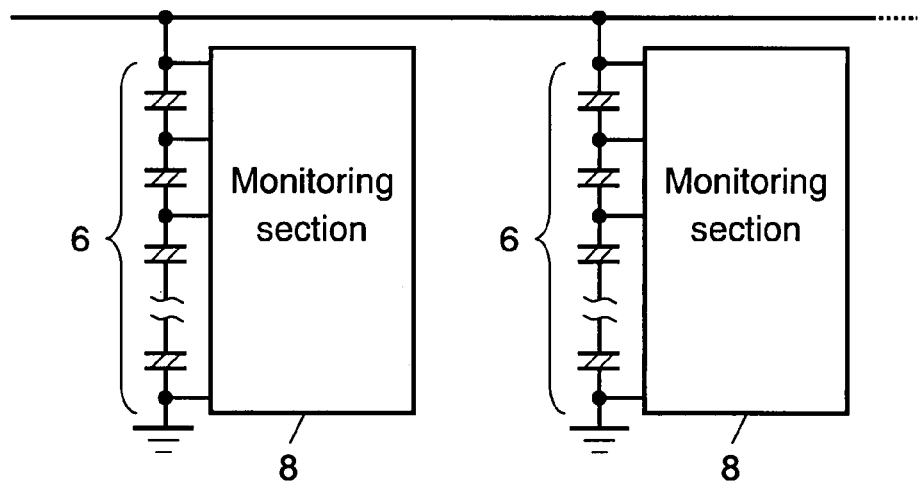
FIG. 8A is a partial circuit diagram of an electrical storage device in which electrical double layer capacitors connected in series-parallel in accordance with the third exemplary embodiment of the present invention, specifically, groups of series-connected capacitors are connected in parallel.
Figure 8B:
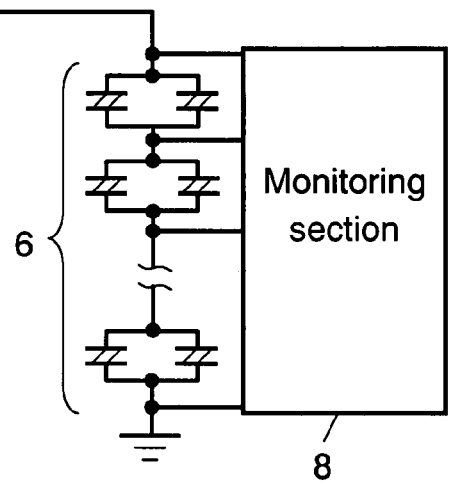
FIG. 8B is a partial circuit diagram of an electrical storage device in which electrical double layer capacitors connected in series-parallel in accordance with the third exemplary embodiment of the present invention, specifically, groups of parallel-connected capacitors are connected in series.
Figure 8C:
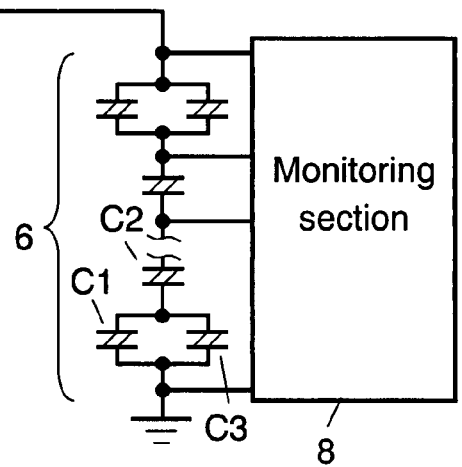
FIG. 8C is a partial circuit diagram of an electrical storage device in which electrical double layer capacitors connected in series-parallel in accordance with the third exemplary embodiment of the present invention, specifically, groups of parallel-connected capacitors and single electrical double layer capacitors are connected in series.

According to the structure in the first through the third embodiments, all the electrical double layer capacitors are connected in series; it is not limited thereto. A series-parallel connection may be employed according to power specifications required for storage section 6. FIGS. 8A through 8C are partial circuit diagrams in which electrical double layer capacitors are connected in a series-parallel arrangement. FIG. 8A is a partial circuit diagram in which groups of capacitors connected in series therein are arranged in parallel. FIG. 8B is a partial circuit diagram in which groups of capacitors connected in parallel therein are arranged in series. FIG. 8C is a partial circuit diagram in which groups of capacitors connected in parallel therein are connected with single capacitors in-series.

In the structure having storage sections 6 in each of which a plurality of electrical double layer capacitors are connected in series are arranged in parallel and which are connected in parallel shown in FIG. 8A, monitor sections 8 are disposed to the structure so as to have an equal number of storage sections 6.

In the structure of FIG. 8B where storage sections 6 each of which is formed of a plurality of electrical double layer capacitors in parallel, are arranged in series, or in the structure of FIG. 8C where storage section 6 is an in-series combination of a parallel connection of the capacitors and a single capacitor, monitor section 8 is connected so as to monitor the voltage at a connection point of the terminals of electrical double layer capacitors that carry a different voltage in charging operations. That is, the structure of the present invention is applicable to storage section 6 having the structure where capacitor C2 is connected in series to a parallel arrangement of capacitor C1 and capacitor C3 as a third capacitor. Additionally, capacitor C3 can be connected to capacitor C2 in parallel. There is no limit to the number of capacitors to be connected in parallel.

Although the first through the third embodiments employ an electrical double layer capacitor with large capacity, it is not limited thereto. However, the capacity of an electrical double layer capacitor tends to be decreased under the influence of ambient temperature and maintaining voltage in general. The voltage monitor according to each of the present embodiments is therefore especially effective when employed for an electrical storage device using an electrical double layer capacitor.

INDUSTRIAL APPLICABILITY

The voltage monitor of the present invention easily detects a short-circuit between input terminals. The monitor is useful for a structure that offers high reliability with the use of capacitors, such as a vehicle axially power unit for emergency use.

The invention claimed is:

1. A voltage monitor configured to detect a voltage applied to both ends of a first capacitor and both ends of a second capacitor, the first and second capacitors being connected in series, a storage section containing at least the first and second capacitors, the voltage monitor comprising:
   a charging circuit configured to apply a charging voltage to the storage section;
   a monitoring section including;
      a first voltage dividing section configured to divide a voltage at a connecting point of the first and second capacitors by a plurality of resistors;
      a first input terminal configured to receive a divided voltage from the first voltage-dividing section;
      a second voltage-dividing section configured to divide a voltage of the second capacitor on a charging-circuit side by a plurality of resistors that takes resistance values so that the second voltage-dividing section outputs a divided voltage different from the divided voltage of the first voltage-dividing section when the first and second capacitors have an identical capacity;
      a second input terminal disposed adjacent to the first input-terminal and configured to receive the divided voltage of the second voltage-dividing section; and
   a temperature detecting section having:
      a third voltage-dividing section formed of a first resistor and a thermistor, third voltage-dividing section being configured to divide a reference voltage; and
      an operational amplifier as a voltage buffer configured to receive a divided voltage of the third voltage-dividing section,
      the temperature-detecting section being configured to output a voltage at a connection point of the first resistor and the thermistor as a temperature output, and
   a third input terminal configured to receive the temperature output; and
   a selector switch configured to select one of the first, second and third input terminals and to output the voltage of the one of input terminals; and
a controller configured to output a selection signal to select one of the first, second and third input terminals to the selector switch, configured to calculate application voltages to the both ends of the first capacitor and the both ends of the second capacitor according to an output from the selector switch, and configured to calculate ambient temperature of the storage section according to the temperature output,
wherein the resistance values of the plurality of resistors composing the first and second voltage-dividing sections are set so that the output from the selector switch shows an abnormal voltage when a short-circuit has occurred between the first and second input terminals, and
the controller detects the short-circuit between the first and second input terminals from the application voltages to the both ends of the first capacitor and the both ends of the second capacitor, the application voltages being calculated from the abnormal voltage, and
the controller detects a short-circuit between the first and third input terminals from a calculated voltages applied to the both ends of the first capacitor and the both ends of the second capacitor according to an abnormal voltage at the first input terminal caused by occurrence of the short-circuit between the first and third input terminals.

2. An electrical storage device comprising:
a storage section at least containing a first capacitor and a second capacitor connected in series; and
the voltage monitor as defined in claim 1.

3. The electrical storage device according to claim 2, wherein the storage section further includes a third capacitor connected in parallel to one of the first capacitor and the second capacitor.

4. The electrical storage device according to claim 2, wherein the first and second capacitors are electrical double layer capacitors.

5. A voltage monitor configured to detect a voltage applied to both ends of a first capacitor and both ends of a second capacitor, the first and second capacitors being connected in series, a storage section containing at least the first and second capacitors, the voltage monitor comprising:
   a charging circuit configured to apply a charging voltage to the storage section;
   a monitoring section including;
      a first voltage dividing section configured to divide a voltage at a connecting point of the first and second capacitors by a plurality of resistors;
      a first input terminal configured to receive a divided voltage from the first voltage-dividing section;
      a second voltage-dividing section configured to divide a voltage of the second capacitor on a charging-circuit side by a plurality of resistors that takes resistance values so that the second voltage-dividing section outputs a divided voltage different from the divided voltage of the first voltage-dividing section when the first and second capacitors have an identical capacity;

a second input terminal disposed adjacent to the first input-terminal and configured to receive the divided voltage of the second voltage-dividing section; and a temperature detecting section having:

a third voltage-dividing section formed of a first resistor and a thermistor, third voltage-dividing section being configured to divide a reference voltage; and a switch configured to receive a voltage at a connection point of the first resistor and the thermistor, the switch being further configured to connect the connection point of the first resistor and the thermistor to a specified voltage when turned on, the temperature-detecting section being configured to output the voltage at the connection point of the first resistor and the thermistor as a temperature output, and a third input terminal configured to receive the temperature output, a selector switch configured to select one of the first, second and third input terminals and to output the voltage of the one of input terminals; and a controller configured to output a selection signal to select one of the first, second and third input terminals to the selector switch, configured to calculate application voltages to the both ends of the first capacitor and the both ends of the second capacitor according to an output from the selector switch, configured to output a selection signal to select the third input terminal to the selector switch when ambient temperature is detected, configured to simultaneously turn off the switch, configured to calculate the ambient temperature of the storage section according to the temperature output, and configured to turn on the switch after calculating the ambient temperature, wherein the resistance values of the plurality of resistors composing the first and second voltage dividing sections are set so that the output from the selector switch shows an abnormal voltage when a short-circuit has occurred between the first and second input terminals, and the controller detects the short-circuit between the first and second input terminals from the application voltages to the both ends of the first capacitor and the both ends of the second capacitor, the application voltages being calculated from the abnormal voltage, and the controller detects a short-circuit between the third input terminal and one of the first and second input terminals by recognizing the specified voltage from one of the first and second input terminals when there is the short-circuit between the third input terminal and one of the first and second input.

6. An electrical storage device comprising:

a storage section at least containing a first capacitor and a second capacitor connected in series; and the voltage monitor as defined in claim 5.

7. The electrical storage device according to claim 6, wherein the storage section further includes a third capacitor connected in parallel to one of the first capacitor and the second capacitor.

8. The electrical storage device according to claim 6, wherein the first and second capacitors are electrical double layer capacitors.

* * * * *